United States Patent
Hertkorn et al.

(10) Patent No.: US 9,761,755 B2
(45) Date of Patent: Sep. 12, 2017

(54) METHOD OF PRODUCING A SEMICONDUCTOR LAYER SEQUENCE AND AN OPTOELECTRONIC SEMICONDUCTOR COMPONENT

(71) Applicant: OSRAM Opto Semiconductors GmbH, Regensburg (DE)

(72) Inventors: Joachim Hertkorn, Wörth an der Donau (DE); Werner Bergbauer, Windberg (DE); Philipp Drechsel, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/120,552

(22) PCT Filed: Feb. 24, 2015

(86) PCT No.: PCT/EP2015/053818
§ 371 (c)(1),
(2) Date: Aug. 22, 2016

(87) PCT Pub. No.: WO2015/128319
PCT Pub. Date: Sep. 3, 2015

(65) Prior Publication Data
US 2017/0012165 A1  Jan. 12, 2017

(30) Foreign Application Priority Data

Feb. 25, 2014  (DE) .................. 10 2014 102 461

(51) Int. Cl.
*H01L 33/02* (2010.01)
*H01L 33/00* (2010.01)
(Continued)

(52) U.S. Cl.
CPC ........ *H01L 33/007* (2013.01); *H01L 33/0075* (2013.01); *H01L 33/12* (2013.01); *H01L 33/20* (2013.01); *H01L 33/58* (2013.01)

(58) Field of Classification Search
CPC ......... H01L 21/02587; H01L 21/02589; H01L 33/007; H01L 33/0075; H01L 33/12; H01L 33/20; H01L 33/58
See application file for complete search history.

(56) References Cited

U.S. PATENT DOCUMENTS 6,091,085 A  7/2000 Lester
7,265,392 B2 9/2007 Hahn et al.
(Continued)

FOREIGN PATENT DOCUMENTS

EP   2 287 924 A2   2/2011

*Primary Examiner* — Daniel Shook
(74) *Attorney, Agent, or Firm* — DLA Piper LLP (US)

(57) ABSTRACT

A method of producing a semiconductor layer sequence includes providing a growth substrate having a growth surface on a growth side, growing a first nitride semiconductor layer on the growth side, growing a second nitride semiconductor layer on the first nitride semiconductor layer, wherein the second nitride semiconductor layer includes at least one opening or at least one opening is produced in the second nitride semiconductor layer or at least one opening is created in the second nitride semiconductor layer during the growing process, removing at least one part of the first nitride semiconductor layer through the openings in the second nitride semiconductor layer, and growing a third nitride semiconductor layer on the second nitride semiconductor layer, wherein the third nitride semiconductor layer covers the openings at least in places.

14 Claims, 3 Drawing Sheets (51) Int. Cl.
*H01L 33/12* (2010.01)
*H01L 33/20* (2010.01)
*H01L 33/58* (2010.01)

(56) References Cited

U.S. PATENT DOCUMENTS

| | | | |
|---|---|---|---|
| 2011/0037098 A1* | 2/2011 | Kim | H01L 21/0237 257/190 |
| 2011/0266552 A1 | 11/2011 | Tu et al. | |
| 2013/0009182 A1 | 1/2013 | Jung et al. | |
| 2013/0146896 A1 | 6/2013 | Lu et al. | |
| 2014/0008766 A1 | 1/2014 | Chen et al. | |
| 2014/0027806 A1 | 1/2014 | Huang et al. | |

* cited by examiner

METHOD OF PRODUCING A SEMICONDUCTOR LAYER SEQUENCE AND AN OPTOELECTRONIC SEMICONDUCTOR COMPONENT

TECHNICAL FIELD

This disclosure relates to a method of producing a semiconductor layer sequence and an optoelectronic semiconductor component comprising such a semiconductor layer sequence.

BACKGROUND

U.S. Pat. No. 6,091,085 describes a method of producing a semiconductor layer sequence and an optoelectronic semiconductor chip having such a semiconductor layer sequence.

There is nonetheless a need to provide a method that can be performed in a particularly cost-effective manner and to produce a particularly efficient optoelectronic semiconductor component.

SUMMARY

We provide a method of producing a semiconductor layer sequence including providing a growth substrate having a growth surface on a growth side, growing a first nitride semiconductor layer on the growth side, growing a second nitride semiconductor layer on the first nitride semiconductor layer, wherein the second nitride semiconductor layer includes at least one opening or at least one opening is produced in the second nitride semiconductor layer or at least one opening is created in the second nitride semiconductor layer during the growing process, removing at least one part of the first nitride semiconductor layer through the openings in the second nitride semiconductor layer, and growing a third nitride semiconductor layer on the second nitride semiconductor layer, wherein the third nitride semiconductor layer covers the openings at least in places.

We also provide an optoelectronic semiconductor component including a growth substrate having a growth surface on a growth side, a first nitride semiconductor layer on the growth side, a second nitride semiconductor layer on the side of the first nitride semiconductor layer facing away from the growth substrate, and a third nitride semiconductor layer on the side of the second nitride semiconductor layer facing away from the first nitride semiconductor layer, wherein the second nitride semiconductor layer includes at least one opening covered by the third nitride semiconductor layer, at least one cavity is arranged between the growth surface and at least one of the nitride semiconductor layers, which cavity is filled with a gas, and the third nitride semiconductor layer includes an active zone that generates radiation or detects radiation.

LIST OF REFERENCE NUMERALS

10 First nitride semiconductor layer
20 Second nitride semiconductor layer
21 Opening
22 Cover surface
23 Lateral surface
30 Third nitride semiconductor layer
31 Active zone
32 Light
50 Growth substrate
51 Growth surface
50a Growth side
60 Cavity
61 Edge of the cavity

DETAILED DESCRIPTION

Our method of producing a semiconductor layer sequence may include a step in which a growth substrate having a growth surface on a growth side is provided. The growth substrate is provided such that semiconductor layers are epitaxially deposited on the growth side on the growth surface of the growth substrate, for example. The growth substrate can be electrically conductive or electrically insulating. Furthermore, the growth substrate can be radiolucent, radiation-reflective or radiation-absorbing. The growth substrate can have a growth surface formed, for example, with sapphire, SiC or silicon. For example, the growth substrate can be a sapphire wafer. The growth substrate is provided to remain in the finished optoelectronic semiconductor component. That is to say, it is not intended to be detached.

The method may include a step in which a first nitride semiconductor layer is grown on the growth side of the growth substrate. The first nitride semiconductor layer can, for example, directly adjoin the growth surface of the growth substrate. It is further possible that at least one further layer, e.g., a buffer layer, is arranged between the growth substrate and the first nitride semiconductor layer.

In general, the layers and elements can in particular each directly adjoin one another. It is further possible that in places further layers such as, e.g., buffer layers are arranged between the described layers.

A nitride semiconductor layer means a single-layer or multi-layer semiconductor layer based on a nitride compound semiconductor material.

"Based on a nitride compound semiconductor material" means that the semiconductor layer sequence or at least a part thereof, in a particularly preferred manner at least one active zone, comprises or consists of a nitride compound semiconductor material, preferably $Al_nGa_mIn_{1-n-m}N$, where $0 \le n \le 1$, $0 \le m \le 1$ and $n+m \le 1$. This material does not absolutely have to exhibit a mathematically exact composition according to the above formula. Rather, it may comprise one or more dopants and additional constituents. For the sake of simplicity, however, the above formula includes only the essential constituents of the crystal lattice (Al, Ga, In, N), even if these may in part be replaced and/or supplemented by small quantities of further substances.

The method may include a step in which a second nitride semiconductor layer is deposited on the first nitride semiconductor layer. The second nitride semiconductor layer comprises a composition differing from the first nitride semiconductor layer. The second nitride semiconductor layer can, in places, directly adjoin the first nitride semiconductor layer. Alternatively or in addition, it is possible that one or more further layers are arranged between the first nitride semiconductor layer and the second nitride semiconductor layer. However, in particular it is preferred that at least one region is provided in which the first nitride semiconductor layer and the second nitride semiconductor layer directly adjoin one another.

The second nitride semiconductor layer comprises at least one opening or at least one opening is produced in the second nitride semiconductor layer or at least one opening, in particular, a plurality of openings is created in the second nitride semiconductor layer during the growing process. In other words, the nitride semiconductor layer, after creating or producing the at least one opening, is not a closed layer but rather the second nitride semiconductor layer is interrupted by the openings. The openings preferably extend at least in places completely through the second nitride semiconductor layer.

In particular, it is possible that the second nitride semiconductor layer includes, in a plane parallel to the main extension direction of the growth surface of the growth substrate, a multiplicity of mutually spaced apart regions not connected together by material of the second nitride semiconductor layer. In other words, the second nitride semiconductor layer can be arranged in a multiplicity of islands consisting of the material of the second nitride semiconductor layer on the side of the first nitride semiconductor layer facing away from the growth substrate. In particular, in the region of these islands, the material of the second nitride semiconductor layer can be in direct contact with the material of the first nitride semiconductor layer in places.

Alternatively or in addition, it is possible that the second nitride semiconductor layer is repeatedly continuous in the plane parallel to the main extension direction of the growth surface of the growth substrate. The second nitride semiconductor layer is in that case, for example, not divided into individual material islands but comprises holes, the openings, that extend completely through the second nitride semiconductor layer in a direction perpendicular to and/or in a direction with a directional component perpendicular to the plane. In the region of these openings, it is possible that the first nitride semiconductor layer is exposed prior to depositing further layers.

The openings can be created during the growth of the second nitride semiconductor layer. For example, a material can be arranged in places between the first nitride semiconductor layer and the second nitride semiconductor layer, wherein the second nitride semiconductor material does not grow, or grows to a slight extent, on the material. At places at which this material is not provided, material of the second nitride semiconductor layer can then be arranged on the first nitride semiconductor layer and from there the described islands consisting of material of the second nitride semiconductor layer can grow.

It is further possible that the openings are created as cracks during the growth process, e.g., owing to differences in the lattice constant between the first nitride semiconductor layer and the second nitride semiconductor layer.

Finally, it is possible that the openings, once the growth of the second nitride semiconductor layer is complete, are produced or enlarged by a process such as etching.

The method may include a step in which at least one part of the first nitride semiconductor layer is removed through the openings in the second nitride semiconductor layer. Owing to the openings in the second nitride semiconductor layer, it is possible that the first nitride semiconductor layer is, or can be, exposed at that location. Via the openings, it is then possible for the first nitride semiconductor layer to be removed, for example, by a chemical or mechanical method at least at that location where it is exposed. In this manner, regions can also be produced beneath the second nitride semiconductor layer from which regions material of the first nitride semiconductor layer previously provided, is then removed.

The method may include a step in which a third nitride semiconductor layer is grown on the second nitride semiconductor layer, wherein the third nitride semiconductor layer covers the openings at least in places.

The third nitride semiconductor layer differs from the first and/or second nitride semiconductor layer in terms of its material, for example. The third nitride semiconductor layer can cover and even fill the openings in the first nitride semiconductor layer. For example, it is then possible that the third nitride semiconductor layer completely covers the second nitride semiconductor layer and the openings in the second nitride semiconductor layer such that, after the growth of the third nitride semiconductor layer, the second nitride semiconductor layer and the openings in the second nitride semiconductor layer can no longer be seen in a near-surface top view with a small penetration depth (e.g., scanning electron microscope) of the semiconductor layer sequence.

In particular, it is possible that the regions from which the material of the first nitride semiconductor layer has been removed through the openings are not filled with the material of the third nitride semiconductor layer, that is to say cavities are provided between the growth substrate and the following semiconductor layers, which cavities are not filled with semiconductor material. These cavities are filled, e.g., with a gas.

The method may include the following steps:

providing a growth substrate having a growth surface on a growth side, growing a first nitride semiconductor layer on the growth side, growing a second nitride semiconductor layer on the first nitride semiconductor layer, wherein the second nitride semiconductor layer comprises at least one opening or at least one opening is produced in the second nitride semiconductor layer or at least one opening is created in the second nitride semiconductor layer during the growing process, removing at least one part of the first nitride semiconductor layer through the openings in the second nitride semiconductor layer, and growing a third nitride semiconductor layer on the second nitride semiconductor layer, wherein the third nitride semiconductor layer covers the openings at least in places.

It is thus possible to create a semiconductor layer sequence in which cavities are provided between the growth substrate and the following semiconductor layer sequences, which cavities are filled, e.g., with a gas. If the semiconductor layer sequence is used in an optoelectronic semiconductor component, then these cavities can be used, e.g., in an optical manner in that the refraction, scattering and/or reflection in the region of the cavities or at the edge of the cavities is utilized.

If the semiconductor layer sequence is used in an optoelectronic or in an electronic semiconductor component, then the method described herein can be used to create a semiconductor layer sequence in which a thermal decoupling is provided in the region of the cavities between the growth surface of the growth substrate and the following semiconductor layers. For example, the cavities filled with gas are less thermally conductive than the semiconductor material surrounding them. In this manner, semiconductor components can be created having regions heated to a greater extent over the cavities than between the cavities. A thermal loading of the growth substrate can also be reduced in the region of the cavities. It is further possible to dissipate the heat produced during operation in a targeted manner via the nitride semiconductor layers.

The second nitride semiconductor layer may have a higher aluminum concentration than the first nitride semiconductor layer. For example, the first nitride semiconductor layer has an aluminum concentration of at the most 10% or at the most 20%. The second nitride semiconductor layer then has an aluminum concentration of at least 1.5% more, in particular at least 5% more, or at least 10% more, than the first nitride semiconductor layer. The aluminum concentration is thus, e.g., at least 21.5% or at least 25% or at least 30%. The second nitride semiconductor layer can, for example, also be formed with, or consist of, AlN.

Owing to the difference in the aluminum concentrations between the first nitride semiconductor layer and the second nitride semiconductor layer, it is, e.g., possible to use a method, e.g., an etching method for the removal of at least one part of the first nitride semiconductor layer in which method the probability of a material removal decreases as the aluminum concentration increases. The first nitride semiconductor layer having the lower aluminum concentration is removed to a greater extent by the method than the second nitride semiconductor layer having the higher aluminum concentration.

Prior to depositing the second nitride semiconductor layer, a mask layer may be arranged between the first nitride semiconductor layer and the second nitride semiconductor layer. The mask layer can, for example, be applied directly onto the first nitride semiconductor layer.

The mask layer is, for example, an atomically thin layer formed with a single-layer material not completely covering the first nitride semiconductor layer.

In a subsequent method step, the second nitride semiconductor layer is grown on the first nitride semiconductor layer with the highest probability at the location where the first nitride semiconductor layer is not covered by the mask layer. In this respect, the mask layer comprises, for example, openings in which the first nitride semiconductor layer is not covered by the mask layer. For example, the mask layer does not completely cover the first nitride semiconductor layer but has a degree of coverage of at least 70% and at the most 90%. For the material of the mask layer, a material is selected by which a selectivity is effected when growing the second nitride semiconductor layer, that is to say the material of the second nitride semiconductor layer grows on the material of the mask layer less effectively than, e.g., on the material of the first nitride semiconductor layer. As a result, it is possible that the material of the second nitride semiconductor layer mainly collects at the openings of the mask layer towards the first nitride semiconductor layer and at that location islands of the material of the second nitride semiconductor layer are produced. The mask layer and the nitride semiconductor layers can preferably be epitaxially deposited in situ.

After growth of the second nitride semiconductor layer, at least one part of the surface of the mask layer facing away from the first nitride semiconductor layer is then free of material of the second nitride semiconductor layer, whereby the second nitride semiconductor layer comprises the at least one opening. That is to say, owing to the mask layer, a selective growth of the second nitride semiconductor layer is produced in the region of the openings of the mask layer. Between the openings of the mask layer, the second nitride semiconductor layer then comprises the at least one opening in the second nitride semiconductor layer.

For example, for the first nitride semiconductor layer a nitride compound semiconductor material having an aluminum concentration of at the most 20% is selected. Then, for the second nitride semiconductor layer, a nitride compound semiconductor material having an aluminum concentration of preferably at least 1.5% more and, e.g., at the most 10% more than that of the first nitride semiconductor layer is selected. The aluminum concentration is thus, e.g., 21.5% to 30%. Then, for the mask layer, silicon nitride, SiN, can be selected as the material.

The mask layer can be deposited in the same epitaxial system, i.e., in situ, as the nitride semiconductor layers. In this example, an SiN layer is thus deposited in situ on a first nitride semiconductor layer.

The SiN mask layer does not completely cover the first nitride semiconductor layer but does so, e.g., to at least 70% and at the most 90%. After depositing the mask layer, an aluminum-containing nitride semiconductor layer, e.g., an AlGaN layer having a higher aluminum concentration than the first nitride semiconductor layer, is deposited. Islands of the second nitride semiconductor layer then form in the openings of the mask layer.

The mask layer may be removed prior to removal of the part of the first nitride semiconductor layer. The mask layer can be removed using the same method as for the first nitride semiconductor layer. If the method is, e.g., an etching method, then initially the mask layer and subsequently the exposed first nitride semiconductor layer can be removed. The second nitride semiconductor layer is in that case not removed at all, or is removed less rapidly, in this etching method, and so at least one residue of the second nitride semiconductor layer remains.

Alternatively or in addition, during growth of the second nitride semiconductor layer, cracks may be produced in the second nitride semiconductor layer forming the openings in the second nitride semiconductor layer. Some of the openings or all of the openings extend completely from the side of the second nitride semiconductor layer facing away from the first nitride semiconductor layer, through the second nitride semiconductor layer, as far as to the first nitride semiconductor layer. For example, instead of the mask layer or in addition to the mask layer, a high aluminum-containing second nitride semiconductor layer can be deposited. For example, this high aluminum-containing layer can also be an AlN layer. Owing to the mismatch with respect to the first nitride semiconductor layer which has a lower aluminum concentration and is formed, e.g., with GaN, cracks are produced after a few nanometers of layer thickness of the second nitride semiconductor material, which cracks form the openings in the second nitride semiconductor layer. The first nitride semiconductor layer is accessible through these openings in the second nitride semiconductor layer, e.g., for process gases which can be used for etching.

At least one part of the first nitride semiconductor layer may be removed by increasing the flow of hydrogen, wherein the first nitride semiconductor layer is removed by a chemical reaction between the hydrogen and the material of the first nitride semiconductor layer. That is to say, the first nitride semiconductor layer is etched, e.g., by the $H_2$ gas. In this manner, removal can take place in the same process chamber as growth of the nitride semiconductor layers. It is possible to increase the temperature in the process chamber and/or decrease the flow of nitrogen in the process chamber, simultaneously with an increase in the flow of hydrogen. For example, the $NH_3$ flow can be reduced for this purpose. By using these measures, dissolving the first nitride semiconductor layer can be accelerated. Furthermore, materials such as $SiH_4$ or HCl can be used.

That is to say, to remove the first nitride semiconductor layer, an $H_2$-rich atmosphere is produced in the process chamber, e.g., an MOVPE process chamber.

If a mask layer, e.g., consisting of SiN is provided, then initially the mask layer and, following therefrom, the first nitride semiconductor layer are etched. In this case, it is advantageous if the first nitride semiconductor layer has an aluminum concentration lower than that of the second nitride semiconductor layer. As the aluminum concentration increases, a nitride semiconductor layer is specifically etched ever more slowly.

The etching medium hydrogen thus undercuts the second nitride semiconductor layer. The etching selectivity between a first nitride semiconductor layer having a smaller aluminum concentration and, e.g., formed with or consisting of GaN, and the second nitride semiconductor layer having a larger aluminum concentration is sufficient to remove several hundred nanometers of layer thickness of the first nitride semiconductor layer by etching. The structures consisting of the material of the second nitride semiconductor layer grown prior to removal are substantially undercut and, as seen in plan view, a change to the second nitride semiconductor layer cannot or can hardly be seen.

After removing one part of the first nitride semiconductor layer, for example, the third nitride semiconductor layer is deposited, whereby the openings and trenches in the material of the second nitride semiconductor layer coalesce.

In an identical manner, gas inclusions are produced beneath the second nitride semiconductor layer by etching through the openings formed as cracks, even in examples without a mask layer.

The third nitride semiconductor layer may include an active zone that generates radiation or detects radiation, that is to say after removal of one part of the first nitride semiconductor layer, a third nitride semiconductor layer is grown in this example which can be part of an optoelectronic semiconductor component. For example, in that case, the optoelectronic semiconductor component can be a light-emitting diode, a laser diode or a photodiode. The cavities, i.e., the gas inclusions between the second nitride semiconductor layer and the growth substrate can be used in particular in an optical manner in such a case.

An optoelectronic semiconductor component is also provided. The optoelectronic semiconductor component can include a semiconductor layer sequence produced using a method described herein. That is to say that all of the features disclosed for the method are also disclosed for the optoelectronic semiconductor component, and vice versa.

The optoelectronic component may include the growth substrate having the growth surface on the growth side. On the growth side, the optoelectronic semiconductor component includes the first nitride semiconductor layer. The second nitride semiconductor layer is arranged on the side of the first nitride semiconductor layer facing away from the growth substrate. The third nitride semiconductor layer is arranged on the side of the second nitride semiconductor layer facing away from the first nitride semiconductor layer. The second nitride semiconductor layer comprises at least one opening covered and/or filled at least in places by the third nitride semiconductor layer.

It is thereby possible that the described semiconductor layer sequence is produced using a method described herein.

At least one cavity may be arranged between the growth surface and the second nitride semiconductor layer, which cavity is filled with a gas, and the third nitride semiconductor layer includes an active zone that generates radiation or detects radiation.

In other words, cavities are provided between the growth surface of the growth substrate and the following semiconductor material, e.g., the second and/or third nitride semiconductor layer, gas being included in the cavities. The cavities can be delimited, for example, by material of the growth substrate and/or material of the nitride semiconductor layers. The size of the cavities can be at least 1 μm or more in length. The diameter (in cross section perpendicular to the plane extending parallel to the main extension direction of the growth surface of the growth substrate) of the cavity can be, on average, at least 10 nm, preferably at least 100 nm, for example, at least 1 μm.

The optoelectronic semiconductor component may include a growth substrate having a growth surface on a growth side, a first nitride semiconductor layer on the growth side, a second nitride semiconductor layer on the side of the first nitride semiconductor layer facing away from the growth substrate, a third nitride semiconductor layer on the side of the second nitride semiconductor layer facing away from the first nitride semiconductor layer, wherein the second nitride semiconductor layer comprises at least one opening covered by the third nitride semiconductor layer, at least one cavity is arranged between the growth surface and at least one of the nitride semiconductor layers, which cavity is filled with a gas, and the third nitride semiconductor layer includes an active layer that generates radiation or detects radiation.

Electromagnetic radiation generated in the active zone or is to be detected in the active zone during operation may be optically influenced by the cavity. For example, the radiation passes through the cavity. The electromagnetic radiation can be, e.g., optically scattered and/or optically refracted in the cavity or at the edge thereof. In this manner, it is possible that the cavities between the growth substrate and the nitride semiconductor layers increase an outcoupling probability for electromagnetic radiation generated in the active zone and/or an entry probability for an electromagnetic radiation to be detected in the active zone in that, for example, the probability of a total reflection, e.g., when radiation exits the semiconductor component is reduced.

The consideration behind an optoelectronic semiconductor component described herein is inter alia that by providing the gas-filled cavities, the use of pre-structured growth substrates, in which the growth surface has a structuring, can be omitted. These substrates can be, for example, so-called Patterned Sapphire Substrates (PSS). However, in contrast to the growth on a flat, unstructured growth surface, growth on a pre-structured growth surface of a substrate means that other epitaxial processes are required. That is to say, when using pre-structured substrates, other—and possibly more expensive—epitaxial processes have to be used which increases the production costs of the optoelectronic semiconductor components. In contrast thereto, the nitride semiconductor layers can be grown in this case using methods used for flat, unstructured growth surfaces of growth substrates. In this manner, an optoelectronic semiconductor component having increased efficiency owing to the cavities and the optical effect thereof can be produced in a more cost-effective manner than is conventionally the case.

The optoelectronic semiconductor component can also comprise, in particular, a radiolucent growth substrate. If the optoelectronic component is a radiation-emitting component such as, for example, a light-emitting diode, then the optoelectronic component can form a so-called volume emitter in which, for example, at least 20%, in particular at least 30%, of the emitted electromagnetic radiation leaves the component through lateral surfaces of the growth substrate. In particular, such optoelectronic semiconductor components are particularly well suited for use in general lighting. However, it is also possible that the majority of the electromagnetic radiation exits on the side facing away from the growth substrate.

That is to say, in the optoelectronic semiconductor component described herein, the growth substrate remains in the component and is not detached.

The second nitride semiconductor layer may cover the growth surface to a larger extent than the first nitride semiconductor layer as seen in a projection onto the growth surface. That is to say, in the production method, so much material is removed from the first nitride semiconductor layer that only a small proportion of the growth surface, e.g., at the most 50%, in particular at the most 30%, is covered with material of the first nitride semiconductor layer. To that effect, coverage with material of the second nitride semiconductor layer, as seen in a projection onto the growth surface, can be higher and can be, for example, at least 35%, preferably at least 55%, at least 75%, at least 95%, up to at least 99%.

The growth surface of the growth substrate may be unstructured, that is to say a growth substrate may comprise a flat growth surface within the scope of production tolerances. The growth surface can extend parallel to the main extension direction of the growth substrate within the scope of production tolerances. However, it is also possible that the growth surface is stepped and extends in an inclined manner relative to the main extension plane of the growth substrate.

In particular, in or on the growth substrate, growth structures are not provided which, e.g., are formed with the material of the growth substrate or another material which differs from the material of the first nitride semiconductor layer.

The methods described herein and the optoelectronic semiconductor components described herein will be explained in more detail hereinafter with the aid of examples and the associated figures.

Identical, similar elements or elements acting in an identical manner are provided with the same reference numerals in the figures. The figures and the size ratios of the elements with respect to each other, as illustrated in the figures, are not to be considered as being to scale. Rather, individual elements can be illustrated excessively large for improved clarity and/or improved understanding.

Figure 1A:
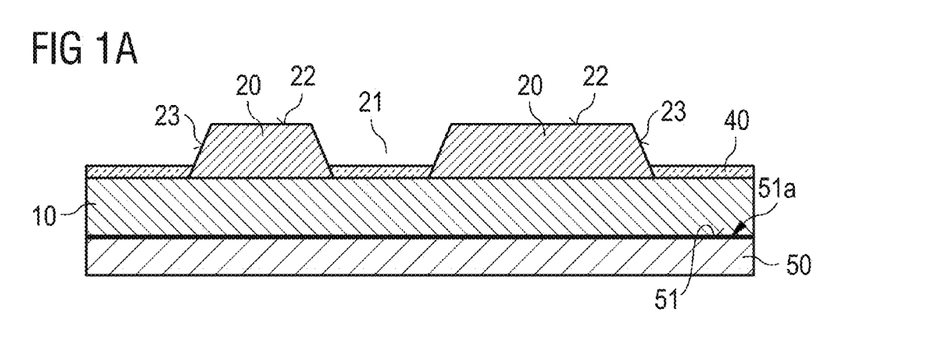
FIGS. 1A, 1B, 1C, 1D show a first example of a method described herein.

A first method step of a method described herein is explained in more detail with the aid of a schematic sectional illustration in conjunction with FIG. 1A. In the example in FIGS. 1A to 1D, initially a growth substrate is provided which is a sapphire substrate formed with, or consists of, sapphire.

The growth substrate 50 comprises a growth surface 51 consisting of sapphire. The growth surface 51 is preferably unstructured, that is to say it does not comprise, for example, any regularly or irregularly arranged elevations and depressions but rather is flat, within the scope of production tolerances, wherein roughnesses of up to 100 nm are possible in sub-regions. The growth surface 51 is arranged on a growth side 50*a* of the growth substrate 50.

For example, the first nitride semiconductor layer 10 is deposited directly onto the growth surface 51. The first nitride semiconductor layer 10 includes a multiplicity of layers and has, e.g., a thickness between at least 10 nm and at the most 2000 nm. The first nitride semiconductor layer is formed, e.g., with $Al_xIn_yGa_{1-x-y}N$. The aluminum concentration x is preferably at the most 20%.

A mask layer 40 is applied onto the top side of the first nitride semiconductor layer 10 facing away from the growth substrate 50, which mask layer is formed with SiN and/or SiGaN or consists of SiN or SiGaN, e.g., $SiGaN_3$. The mask layer has, e.g., a thickness of at the most 50 nm, in particular at the most 10 nm. For example, the mask layer is formed by a single-layer material having uncovered regions. For example, the mask layer does not completely cover the first nitride semiconductor layer 10 but does so to at least 70% and at the most 90%. For this purpose, the mask layer 40 comprises openings towards the first nitride semiconductor layer, which openings have a diameter of, e.g., at least 100 nm and at the most 1000 nm.

In a subsequent method step, a second nitride semiconductor layer 20 is deposited on the mask layer 40 and the first nitride semiconductor layer 10.

The second nitride semiconductor layer is formed, e.g., with $Al_xGa_{1-x}N$, wherein the aluminum concentration x is, e.g., at least 1.5% more and, e.g., at the most 10% more than in the first nitride semiconductor layer. The second nitride semiconductor layer grows selectively, preferably on the first nitride semiconductor layer 10 and not on the mask layer 40. As a result, islands consisting of the material of the second nitride semiconductor layer 20 are formed, between which islands openings 21 of the second nitride semiconductor layer 20 are formed. For example, the distance between directly adjacent islands consisting of material of the second nitride semiconductor layer 20 is at least 10 nm and at the most 500 nm.

The second nitride semiconductor layer comprises a cover surface on its side facing away from the first nitride semiconductor layer 10, which cover surface extends, e.g., parallel to the crystallographic C plane. The lateral surfaces 23 of the islands consisting of the material of the second nitride semiconductor layer 20 are inclined relative to the crystallographic C plane. At that location, the aluminum concentration is less than at the cover surface 22.

Figure 1B:
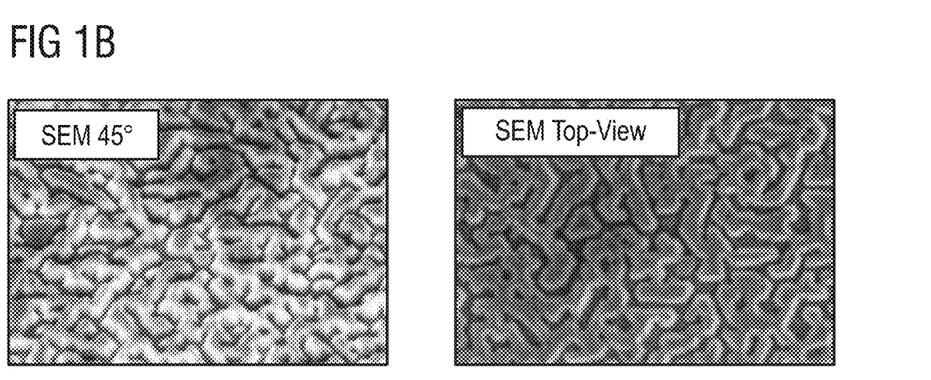

FIG. 1B shows SEM images at a angle of 45° and in the plan view of the islands consisting of the material of the second semiconductor layer sequence 20. The mask layer 40 or the first nitride semiconductor layer 10 can be seen between these islands.

Figure 1C:
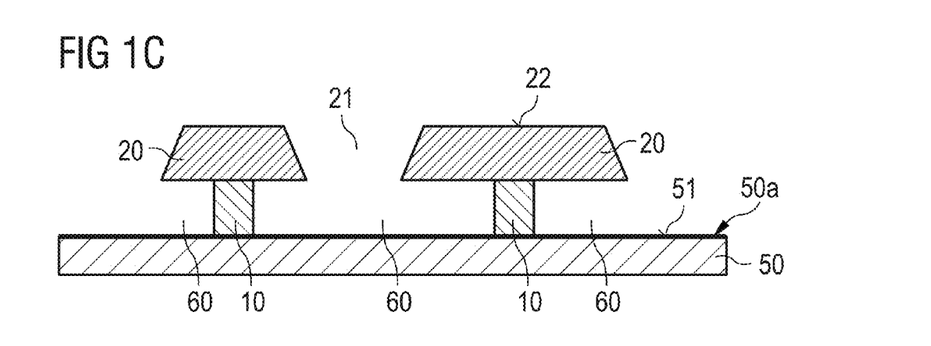

In a subsequent method step, in FIG. 1C, the material of the first nitride semiconductor layer 10 is etched back in a hydrogen atmosphere. The material of the first nitride semiconductor layer 10 is removed in places, whereby cavities 60 are produced beneath the second nitride semiconductor layer 20. In a subsequent method step, FIG. 1D, the third nitride semiconductor layer 30 is applied, which layer includes, e.g., an active zone 31 that generates and/or detects electromagnetic radiation.

Figure 1D:
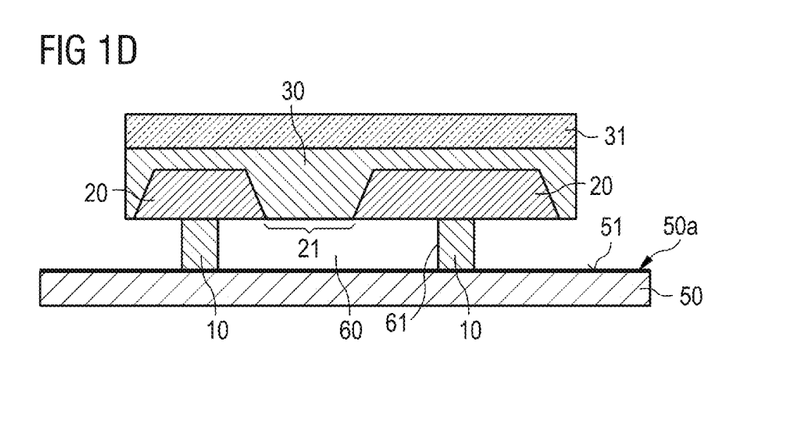

Alternatively, the active zone 31 can be the functional layer of an electronic semiconductor component. A semiconductor layer sequence is produced, in which cavities 60 are formed between the growth substrate 50 and the material of the semiconductor layers, which cavities are filled with a gas.

Figure 2:
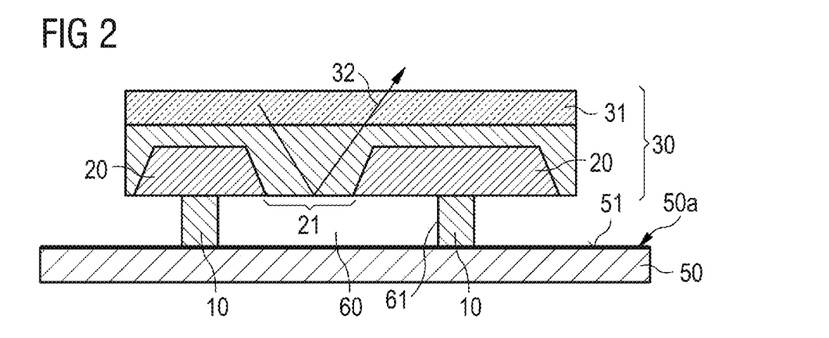
FIG. 2 shows a schematic sectional illustration of a first example of an optoelectronic semiconductor component described herein.

An optoelectronic semiconductor component described herein is explained in more detail in conjunction with the schematic sectional illustration in FIG. 2. The optoelectronic semiconductor component is, e.g., a radiation-generating semiconductor component in which electromagnetic radiation, e.g., light 32 is generated in the active zone 31 of the third nitride semiconductor layer 30. As can be seen in FIG. 2, a total reflection and/or scattering of the light 32 takes place at the cavities 60, e.g., at the edge of the cavities 60 owing to the refractive index jump and/or the rough structure of the edge of the cavities 60. In this manner, the cavities 60 can act as optical structuring which increases the efficiency of the optoelectronic semiconductor component.

Figure 3A:
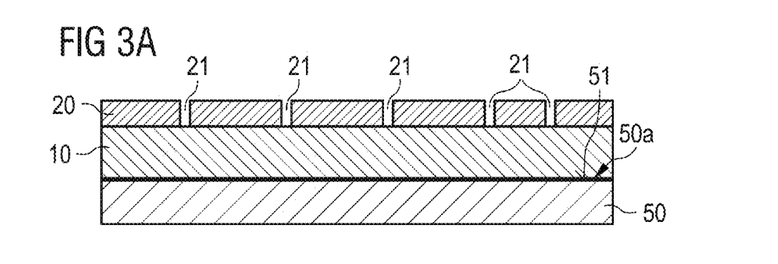
FIGS. 3A, 3B, 3C show schematic sectional illustrations of a second example of a method described herein.
Figure 3B:
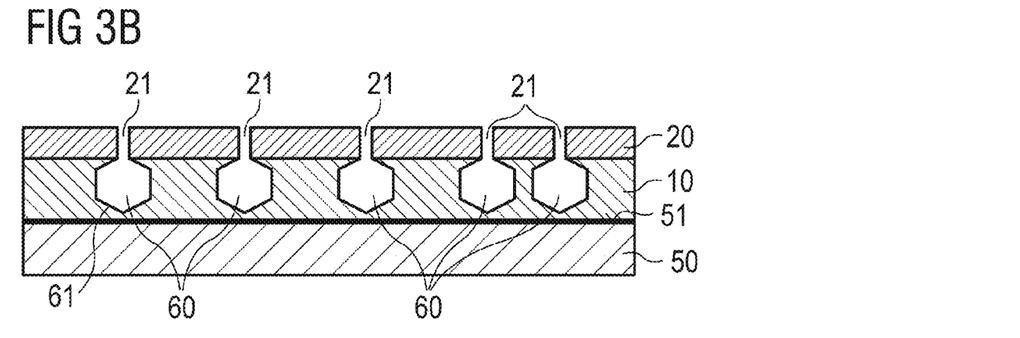
Figure 3C:
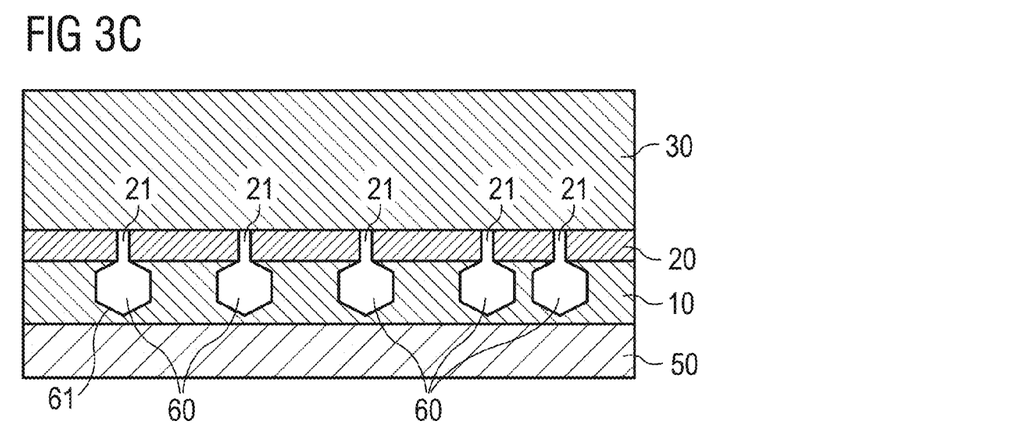

A further example of a method described herein is explained in more detail in conjunction with the schematic sectional illustrations in FIGS. 3A to 3C. In this method, a growth substrate 50 is again provided with a growth surface 51 on a growth side 50a. The growth substrate can be, e.g., a sapphire substrate or a silicon substrate.

The first nitride semiconductor layer 10 is deposited on the growth surface 50. The first nitride semiconductor layer 10 can be formed, e.g., with $Al_xIn_yGa_{1-x-y}N$, wherein the aluminum concentration is, e.g., at the most 20%. The second nitride semiconductor layer 20 follows the side of the first nitride semiconductor layer 10 facing away from the growth substrate 50. The second nitride semiconductor layer 20 is formed, e.g., with AlGaN or AlN and has a higher aluminum concentration than the underlying first nitride semiconductor layer. In this example, the aluminum concentration in the second nitride semiconductor layer can also be more than 25%, in particular more than 50%, e.g., 100%.

Owing to the difference in the lattice constants between the first nitride semiconductor layer and the second nitride semiconductor layer, cracks are formed upon relaxation of the second nitride semiconductor layer during or after growth of the second nitride semiconductor layer. The second nitride semiconductor layer 20 can have, e.g., a lower lattice constant than the first nitride semiconductor layer 10. The layer thickness of the second nitride semiconductor layer is, e.g., at least 5 nm and at the most 100 nm.

In the next method step, FIG. 3B, the first nitride semiconductor layer 10 is selectively etched through the openings 21 formed by the cracks in the overlying second nitride semiconductor layer 20. As a result, cavities 60 are produced which are delimited, for example, by the material of the first nitride semiconductor layer 10 and the material of the second nitride semiconductor layer 20.

In the next method step, FIG. 3C, the third nitride semiconductor layer 30 is deposited on the side of the second nitride semiconductor layer 20 facing away from the first nitride semiconductor layer 10. The third nitride semiconductor layer 30 covers the openings 21 in the second nitride semiconductor layer 20. The third nitride semiconductor layer 30 is formed, e.g., with AlInGaN. The third nitride semiconductor layer 30 can be designed, at least in places, in an identical manner to the first nitride semiconductor layer 10. Furthermore, the third nitride semiconductor layer 30 can include an active zone 31 in which, for example, electromagnetic radiation is generated or detected during operation.

Figure 4:
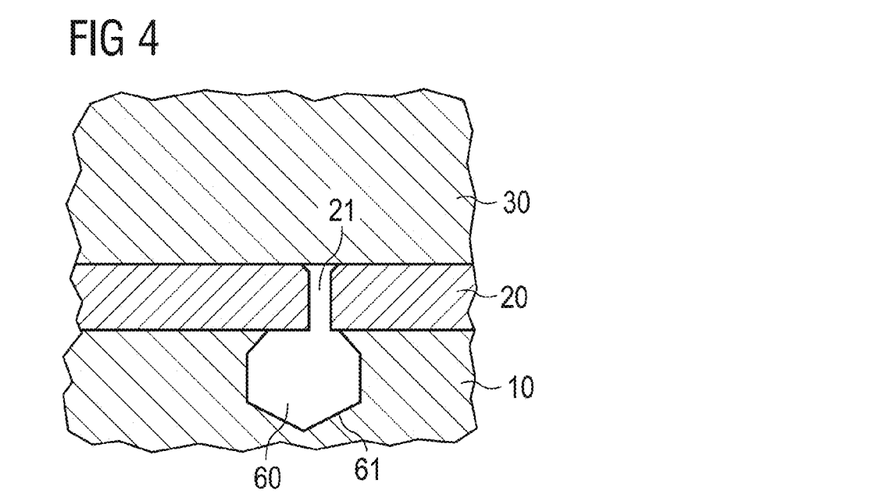
FIG. 4 shows a schematic sectional illustration of a further example of an optoelectronic semiconductor component described herein.

FIG. 4 shows a sectional illustration corresponding to a TEM image of such a semiconductor layer sequence having a first nitride semiconductor layer 10, a second nitride semiconductor layer 20 and a third nitride semiconductor layer 30. A crack in the second nitride semiconductor layer 20 can clearly be seen, which crack forms an opening 21 in the second nitride semiconductor layer 20 extending completely through the second nitride semiconductor layer 20. The cavity 60 is produced by etching with hydrogen gas at the end point of the crack in the first nitride semiconductor layer 10. Use is made of the fact that the etching rate is greater the smaller the aluminum proportion in the first nitride semiconductor layer 10.

In this example, the mask layer formed, e.g., with silicon nitride can be omitted, whereby an influence in defect formation in the semiconductor layers, which is normally effected by the mask layer, is prevented.

The cavities 60 described herein increase the rate of the outcoupling of light, e.g., in radiation-generating semiconductor components. In the plan view of a radiation exit surface of the thus produced optoelectronic semiconductor component, the cavities can be seen as bright points in the luminous field. The density of the cavities 60 can be adjusted by adapting the growth conditions of the second nitride semiconductor layer 20. For example, the density of the openings 21 and thus the density of the cavities 60 can be increased by increasing the time for which the material of the second nitride layer 20 is deposited. The size of the cavities, e.g., their maximum diameter can be adjusted by the etching time, the ratio of $H_2$ to $N_2$, the amount of $NH_3$ and/or the temperature and/or pressure in the process chamber.

The description made with reference to the examples does not restrict this disclosure to these examples. Rather, the disclosure encompasses any new feature and any combination of features, including in particular any combination of features in the appended claims, even if the feature or combination is not itself explicitly indicated in the claims or examples.

The priority of DE 10 2014 102 461.3 is claimed, the subject matter of which is hereby expressly incorporated by reference.

The invention claimed is:

1. A method of producing a semiconductor layer sequence comprising:
    providing a growth substrate having a growth surface on a growth side,
    growing a first nitride semiconductor layer on the growth side,
    growing a second nitride semiconductor layer on the first nitride semiconductor layer, wherein the second nitride semiconductor layer comprises at least one opening or at least one opening is produced in the second nitride semiconductor layer or at least one opening is created in the second nitride semiconductor layer during the growing process,
    removing at least one part of the first nitride semiconductor layer through the openings in the second nitride semiconductor layer, and
    growing a third nitride semiconductor layer on the second nitride semiconductor layer, wherein the third nitride semiconductor layer covers the openings at least in places.

2. The method according to claim 1, wherein the second nitride semiconductor layer has a higher aluminum concentration than the first nitride semiconductor layer.

3. The method according to claim 1, wherein
    a mask layer is arranged between the first nitride semiconductor layer and the second nitride semiconductor layer,
    the second nitride semiconductor layer is grown on the first nitride semiconductor layer at a location where the first nitride semiconductor layer is not covered by the mask layer, and
    at least one part of the surface of the mask layer facing away from the first nitride semiconductor layer is free of material of the second nitride semiconductor layer, whereby the second nitride semiconductor layer comprises the at least one opening.

4. The method according to claim 3, wherein the mask layer is removed prior to removal of at least one part of the first nitride semiconductor layer.

5. The method according to claim 4, wherein the mask layer is removed using the same method as the first nitride semiconductor layer.

6. The method according to claim 1, wherein during growth of the second nitride semiconductor layer, cracks are produced in the second nitride semiconductor layer which form the openings in the second nitride semiconductor layer, and at least some of the openings extend completely from the top side of the second nitride semiconductor layer facing away from the first nitride semiconductor layer through the second nitride semiconductor layer as far as to the first nitride semiconductor layer.

7. The method according to claim 1, wherein at least one part of the first nitride semiconductor layer is removed by etching with a $H_2$ gas.

8. The method according to claim 7, wherein the etching is performed in a process chamber, wherein the temperature of the process chamber is higher during the etching than before or after the etching.

9. The method according to claim 1, wherein the third nitride semiconductor layer includes an active zone that generates radiation or detects radiation.

10. The method according to claim 1, wherein the growth surface remains unstructured.

11. An optoelectronic semiconductor component comprising:
   a growth substrate having a growth surface on a growth side,
   a first nitride semiconductor layer on the growth side,
   a second nitride semiconductor layer on the side of the first nitride semiconductor layer facing away from the growth substrate, and
   a third nitride semiconductor layer on the side of the second nitride semiconductor layer facing away from the first nitride semiconductor layer, wherein
   the second nitride semiconductor layer comprises at least one opening covered by the third nitride semiconductor layer,
   at least one cavity is arranged between the growth surface and at least one of the nitride semiconductor layers, which cavity is filled with a gas, and
   the third nitride semiconductor layer includes an active zone that generates radiation or detects radiation.

12. The optoelectronic semiconductor component according to claim 11, wherein the second nitride semiconductor layer covers the growth surface to a larger extent than the first nitride semiconductor layer, as seen in a projection onto the growth surface.

13. The optoelectronic semiconductor component according to claim 11, wherein the growth surface is unstructured.

14. The optoelectronic semiconductor component according to claim 11, wherein electromagnetic radiation generated in the active zone or is to be detected in the active zone during operation passes through the at least one cavity and/or is optically scattered and/or optically refracted at the edge of the at least one cavity.

* * * * *